(12) United States Patent
Minami et al.

(10) Patent No.: US 9,887,262 B2
(45) Date of Patent: Feb. 6, 2018

(54) SEMICONDUCTOR DEVICE

(71) Applicant: Toshiba Memory Corporation, Minato-ku (JP)

(72) Inventors: Yoshihiro Minami, Yokkaichi (JP); Jun Iijima, Yokkaichi (JP); Tetsuya Shimizu, Yokkaichi (JP); Takamasa Usui, Yokkaichi (JP); Masayoshi Tagami, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 22 days.

(21) Appl. No.: 14/837,295

(22) Filed: Aug. 27, 2015

(65) Prior Publication Data
US 2016/0247783 A1 Aug. 25, 2016

Related U.S. Application Data

(60) Provisional application No. 62/119,434, filed on Feb. 23, 2015.

(51) Int. Cl.
*H01L 23/48* (2006.01)
*H01L 23/52* (2006.01)
*H01L 29/40* (2006.01)
*H01L 29/06* (2006.01)
*H01L 23/532* (2006.01)
*H01L 29/788* (2006.01)
(Continued)

(52) U.S. Cl.
CPC ...... *H01L 29/0649* (2013.01); *H01L 23/5226* (2013.01); *H01L 23/5329* (2013.01); *H01L 23/53295* (2013.01); *H01L 29/6656* (2013.01); *H01L 29/66825* (2013.01); *H01L 29/788* (2013.01); *H01L 27/11521* (2013.01)

(58) Field of Classification Search
CPC ............. H01L 29/0649; H01L 23/4821; H01L 23/5226; H01L 23/5329; H01L 27/11529; H01L 29/6656; H01L 27/10888; H01L 23/53295; H01L 29/66825; H01L 29/788
USPC ........................................ 257/774, 758, 773
See application file for complete search history.

(56) References Cited

U.S. PATENT DOCUMENTS 9,177,891 B2 * 11/2015 Kim .................. H01L 27/10885
2008/0067678 A1 * 3/2008 Kim .................. H01L 21/76801
257/750

(Continued)

*Primary Examiner* — Shouxiang Hu
(74) *Attorney, Agent, or Firm* — Oblon, McClelland, Maier & Neustadt, L.L.P.

(57) ABSTRACT

A semiconductor device includes a semiconductor layer and a first insulating film provided on the semiconductor layer. The first insulating film has a surface opposite to the semiconductor layer, the surface including a first portion, a second portion and a third portion between the first portion and the second portion. The device includes a first interconnection provided on a first portion and a second interconnection provided on the second portion. The first interconnection and the second interconnection extend in a first direction. The device further includes a conductor and a nitride layer. The conductor extends through the first insulating film in a second direction from each of the first interconnection and the second interconnection toward the semiconductor layer, and the conductor electrically connects the first interconnection to the semiconductor layer. The nitrided layer is provided at least on the third surface.

9 Claims, 21 Drawing Sheets

(51) Int. Cl.
    *H01L 29/66*     (2006.01)
    *H01L 23/522*     (2006.01)
    *H01L 27/11521*     (2017.01)

(56) References Cited

U.S. PATENT DOCUMENTS

| | | | |
|---|---|---|---|
| 2009/0020880 A1* | 1/2009 | Paik | H01L 21/31111 257/773 |
| 2009/0085083 A1* | 4/2009 | Shin | H01L 21/76804 257/297 |
| 2009/0179332 A1* | 7/2009 | Ono | H01L 21/76804 257/758 |
| 2010/0301489 A1* | 12/2010 | Seidel | H01L 21/76804 257/773 |
| 2015/0076708 A1 | 3/2015 | Kaneko et al. | |

\* cited by examiner

US 9,887,262 B2

SEMICONDUCTOR DEVICE

CROSS-REFERENCE TO RELATED APPLICATIONS

This application is based upon and claims the benefit of priority from U.S. Provisional Patent Application 62/119,434 filed on Feb. 23, 2015; the entire contents of which are incorporated herein by reference.

FIELD

Embodiments described herein relate generally to a semiconductor device.

BACKGROUND

As the integration of a semiconductor device becomes high, the spacing between interconnections in the semiconductor device becomes narrow; and there is a risk that the insulation breakdown voltage may decrease and the interconnection resistance and parasitic capacitance may increase. For example, when performing large-scale integration of memory cells of a NAND nonvolatile memory device, bit lines that electrically connect memory strings to sense amplifiers are made narrower; and the spacing of the bit lines is made narrower. Thereby, a decrease of the operation speed of the memory device and/or short failures between the bit lines may occur.

DETAILED DESCRIPTION

Figure 1A:
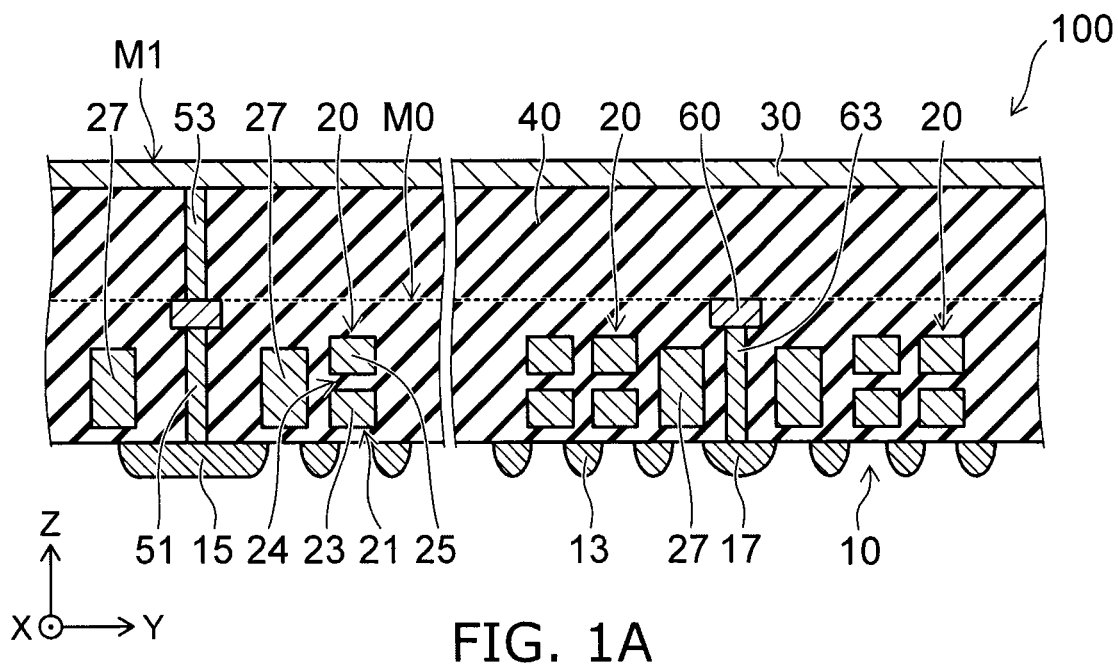
FIGS. 1A and 1B are schematic views showing a semiconductor device according to a first embodiment.

According to one embodiment, a semiconductor device includes a semiconductor layer and a first insulating film provided on the semiconductor layer. The first insulating film has a surface opposite to the semiconductor layer, the surface including a first portion, a second portion and a third portion between the first portion and the second portion. The device includes a first interconnection provided on a first portion and a second interconnection provided on the second portion. The first interconnection and the second interconnection extend in a first direction. The device further includes a conductor and a nitride layer. The conductor extends through the first insulating film in a second direction from each of the first interconnection and the second interconnection toward the semiconductor layer, and the conductor electrically connects the first interconnection to the semiconductor layer. The nitrided layer is provided at least on the third surface.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

[First Embodiment]

Figure 1B:
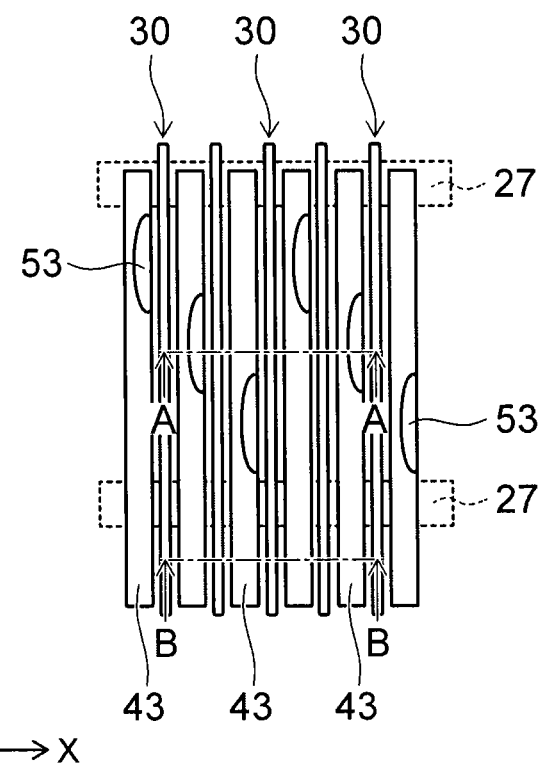

FIGS. 1A and 1B are schematic views showing a semiconductor device 100 according to a first embodiment. The semiconductor device 100 is, for example, NAND flash memory. FIG. 1A is a schematic cross-sectional view showing the configuration of the semiconductor device 100. FIG. 1B is a schematic plan view showing the arrangement of bit lines 30 of the semiconductor device 100.

As shown in FIG. 1A, the semiconductor device 100 includes a semiconductor layer 10, and multiple memory cells 20 and selection gates 27 provided on the semiconductor layer 10. The multiple memory cells 20 are arranged on the semiconductor layer 10; and the selection gates 27 are provided on two sides of the multiple memory cells 20. Each of the memory cells 20 includes a floating gate 23 provided on the semiconductor layer 10 with a tunneling insulating film 21 interposed, and a control gate 25 provided on the floating gate 23 with a blocking insulating film 24 interposed.

The semiconductor layer 10 is, for example, a p-type semiconductor and includes source/drain regions 13, a drain region 15, and a source region 17 that are n-type regions provided at the front surface of the semiconductor layer 10. The source/drain regions 13 are provided between the adjacent memory cells 20 and between the memory cell 20 and the selection gate 27.

Thus, the semiconductor device 100 includes a NAND string including the multiple memory cells 20 and the selection gates 27 disposed on the semiconductor layer 10. Multiple first interconnections (hereinbelow, the bit lines 30) are disposed above the NAND memory string with an inter-layer insulating film 40 interposed. Each of the bit lines 30 extends in a first direction (hereinbelow, a Y-direction) parallel to the semiconductor layer 10.

In the example shown in FIG. 1A, the inter-layer insulating film 40 includes an interconnection layer M0 between the semiconductor layer 10 and the bit lines 30. The multiple bit lines 30 are included in an interconnection layer M1 provided on the inter-layer insulating film 40. The interconnection layer M0 includes, for example, a source line 60 and a gate interconnection (not shown).

As shown in FIG. 1A, the bit line 30 is electrically connected to the semiconductor layer 10 via contact plugs 51 and 53. The contact plug 51 extends through the inter-layer insulating film 40 in a second direction (hereinbelow, a Z-direction).

The contact plug 51 is provided between the semiconductor layer 10 and the interconnection layer M0. One end of the contact plug 51 contacts the drain region 15 provided in the semiconductor layer 10. Thereby, the contact plug 51 is electrically connected to one end of the NAND string. The selection gate 27 is disposed between the contact plug 51 and the multiple memory cells 20.

The contact plug 53 is provided between the interconnection layer M0 and the interconnection layer M1. The contact plug 53 extends through the inter-layer insulating film 40 in the Z-direction; and one end of the contact plug 53 is connected to the bit line 30. The other end of the contact plug 53 is electrically connected to the contact plug 51.

The source line 60 is electrically connected to the other end of the NAND string via a contact plug 63. One end of the contact plug 63 contacts the source region 17; and the other end of the contact plug 63 contacts the source line 60. Another selection gate 27 is disposed between the contact plug 63 and the multiple memory cells 20.

As shown in FIG. 1B, the bit lines 30 extend in the Y-direction. Also, the multiple bit lines 30 are disposed to be arranged in a third direction (hereinbelow, an X-direction). A recess 43 is provided between the mutually-adjacent bit lines 30. The recess 43 extends in the Y-direction and is a trench provided in the inter-layer insulating film 40. Each of the bit lines 30 is provided on the contact plug 53 provided in the space between the mutually-adjacent selection gates 27.

The manufacturing processes of the multiple bit lines 30 will now be described with reference to FIGS. 2A to 5B. FIGS. 2A to 5B are schematic cross-sectional views showing the manufacturing processes of the interconnections of the semiconductor device according to the first embodiment. Each of FIG. A is a cross section taken along line A-A in FIG. 1B. Each of FIG. B is a cross section taken along line B-B in FIG. 1B.

Figure 2A:
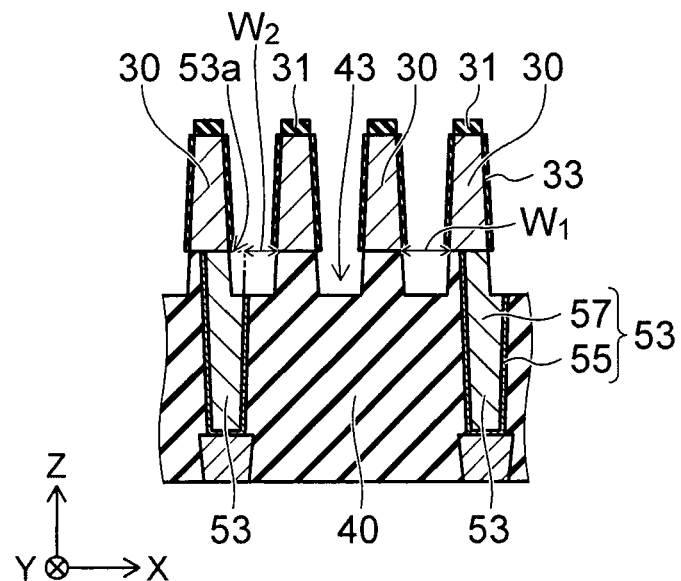
FIGS. 2A to 5B are schematic cross-sectional views showing a manufacturing processes of interconnections of the semiconductor device according to the first embodiment.
Figure 2B:
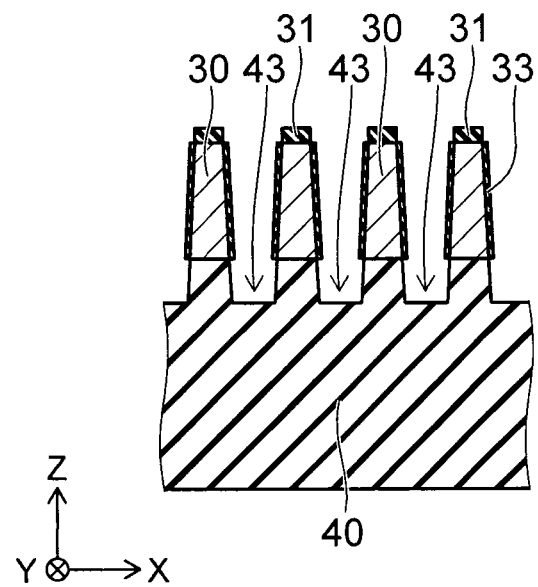

As shown in FIGS. 2A and 2B, the bit lines 30 are provided on the inter-layer insulating film 40. For example, the bit lines 30 are formed using a mask 31 to selectively perform dry etching of a tungsten film deposited on the inter-layer insulating film 40. The inter-layer insulating film 40 is, for example, a silicon oxide film. The inter-layer insulating film 40 has a surface opposite to the semiconductor layer 10. The bit lines 30 are provided on the surface of the inter-layer insulating film 40. The surface of the inter-layer insulating film 40 includes a portion on which the bit lines 30 are not provided, i.e. an inner-surface of the recess 43.

As shown in FIG. 2A, the bit lines 30 are provided respectively on the contact plugs 53. The contact plug 53 includes, for example, a barrier metal 55 that covers the inner surface of a contact hole made in the inter-layer insulating film 40, and a conductor 57 that buries the inner surface of the contact hole. The barrier metal is, for example, titanium nitride (TiN). The conductor 57 is, for example, tungsten (W).

Further, a recess 43 is made directly under the space between the adjacent bit lines 30 by etching the inter-layer insulating film 40 using the bit lines 30 as a mask. The recess 43 is made to communicate with the space between the bit lines 30 via an opening having the same width as spacing W1 between the adjacent bit lines 30. At this time, as shown in FIG. 2A, a cutaway portion 53a is formed by a portion of the upper end of the contact plug 53 being etched.

In the specification, "same" is not limited to the case of the strict meaning of being the same and includes, for example, the case of being about the same in which differences caused by the precision of manufacturing processes are tolerated.

For example, in the case where positional shift occurs when aligning the bit lines 30 with the contact plugs 53, a portion of the contact plug 53 appears directly under the space between the adjacent bit lines 30. Then, in the case where the memory cells 20 are disposed with high density and the spacing of the adjacent bit lines 30 becomes narrow, spacing W2 between the contact plug 53 and the bit line 30 also becomes narrow. Therefore, there is a risk that an increase of the leakage current between the adjacent bit lines 30 and a decrease of the insulation breakdown voltage between the bit lines 30 may occur and reduce the manufacturing yield of the semiconductor device 100.

Therefore, in the embodiment, the recess 43 is made; and the cutaway portion 53a is formed in the upper end of the contact plug 53. Thereby, the spacing between the contact plug 53 and the adjacent bit line 30 can be widened; the leakage current between the contact plug 53 and the adjacent bit line 30 can be suppressed; and the insulation breakdown voltage can be increased.

Also, as shown in FIGS. 2A and 2B, an oxide film 33 is formed on the side surfaces of the bit lines 30 in the process of forming the bit lines 30 and making the recess 43 by etching the tungsten film. The oxide film 33 is, for example, tungsten oxide.

Figure 3A:
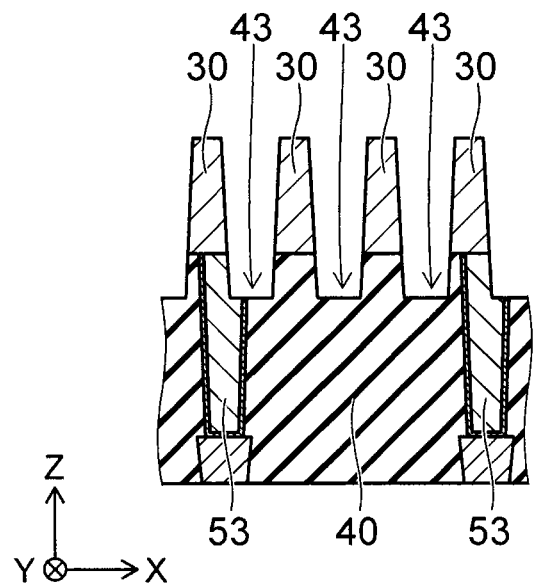
Figure 3B:
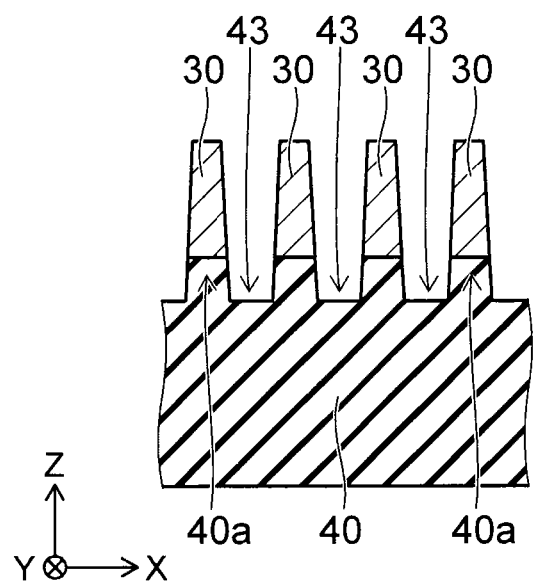

FIGS. 3A and 3B are schematic views showing cross sections after the mask 31 is removed. The mask 31 is, for example, a silicon oxide film and can be removed by diluted hydrogen fluoride solution (DHF). Further, the wafer is cleaned by heated alkaline cleaning fluid (TMY). Thereby, the mask 31 and the oxide film 33 can be removed.

By removing the oxide film 33, the width of the bit line in the X-direction becomes narrow. For example, in the semiconductor device 100 having higher integration, not only does the spacing of the adjacent bit lines 30 become narrow, but also the width of the bit line 30 becomes narrow. Accordingly, by further removing the oxide film 33, there is a risk that the interconnection resistance of the bit lines 30 may become large. Therefore, it is favorable for the oxide film 33 to be reduced prior to removing the mask 31. Thereby, the oxide film 33 returns to tungsten; and the narrowing of the bit line 30 can be suppressed.

Figure 4A:
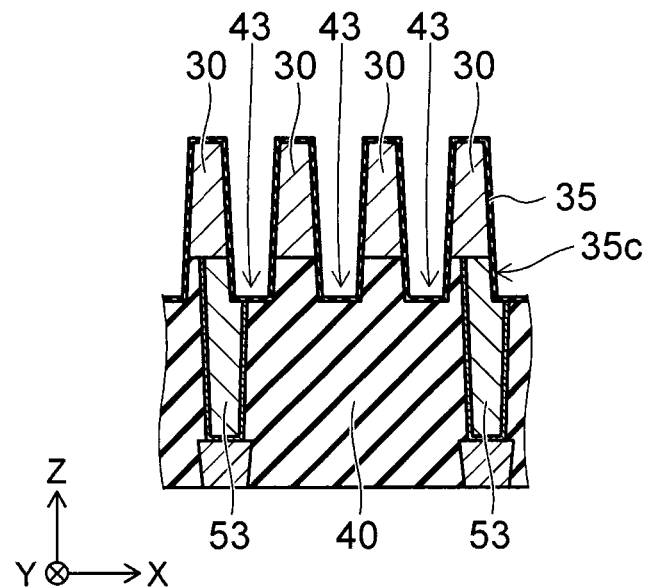
Figure 4B:
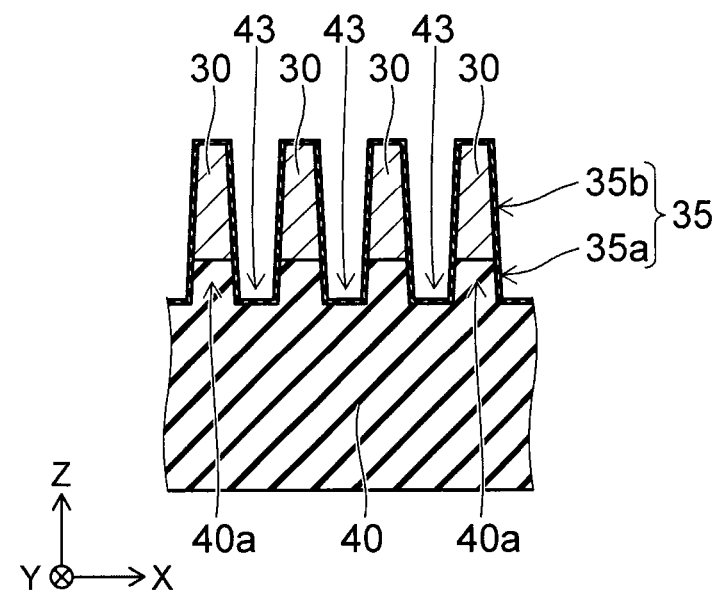

FIGS. 4A and 4B are schematic views showing cross sections after a nitride film 35 is formed on the surfaces of the bit lines 30 and the inner surfaces of the recesses 43. For example, the surfaces of the bit lines 30 and the recesses 43 can be nitrided by exposing to plasma-excited nitrogen radicals. Specifically, the surfaces of the bit lines 30 and the recesses 43 are nitrided by exposing the wafer in which the bit lines 30 and the recesses 43 are made to a gas plasma including nitrogen. Also, the plasma-excited nitrogen radicals may be supplied to the wafer surface.

The nitride film 35 includes a first portion 35a that contacts the inter-layer insulating film 40, a second portion 35b that contacts the bit line 30, and a third portion 35c that contacts the cutaway portion 53a. The first portion 35a is, for example, a silicon nitride film (or a silicon oxynitride film) of a nitrided silicon oxide film; and the second portion 35b and the third portion 35c are, for example, tungsten nitride films of nitrided tungsten. Also, the nitride film 35 is resistant to DHF.

To downscale the bit lines 30, for example, it is effective to form an etching mask using a sidewall process. For example, a sidewall process is described in detail in United States Patent Publication No. 2014/0319700A1. In the sidewall process, for example, a tungsten film is etched using the mask 31; and subsequently, a loop cut is performed to separate the bit lines 30 that are linked to each other. In other words, the linking portion of the bit lines 30 is etched selectively. Moreover, surface oxidation, DHF processing, and TMY processing of the bit lines 30 are repeated in this process.

In the embodiment, the oxidization of the tungsten in the loop cut process can be suppressed because the nitride film 35 is formed on the surfaces of the bit lines 30 and the recesses 43. Thereby, further narrowing of the bit lines 30 is avoided; and the increase of the interconnection resistance can be avoided. Also, because the nitride film 35 is resistant to the DHF processing, etching of pedestal portions 40a of the bit lines 30 can be prevented. Thereby, the narrowing of the pedestal portions 40a is avoided; and the collapse or peeling of the bit lines 30 can be prevented.

Figure 5A:
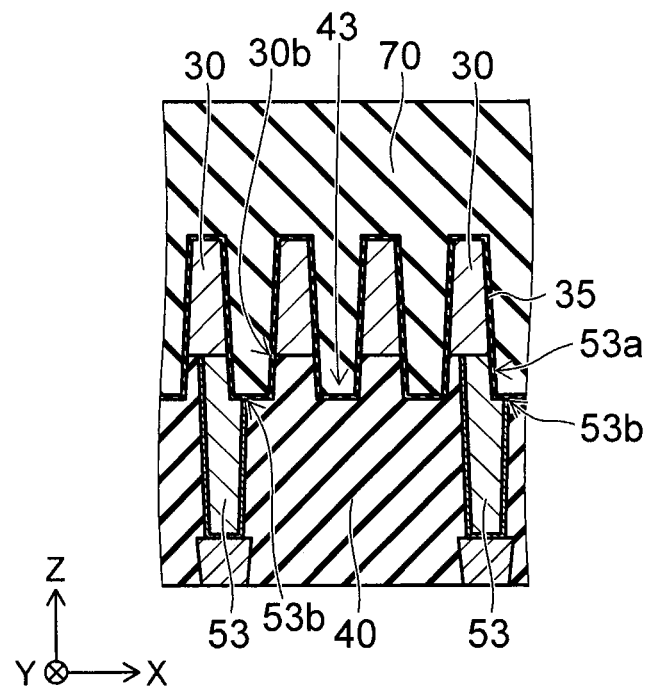
Figure 5B:
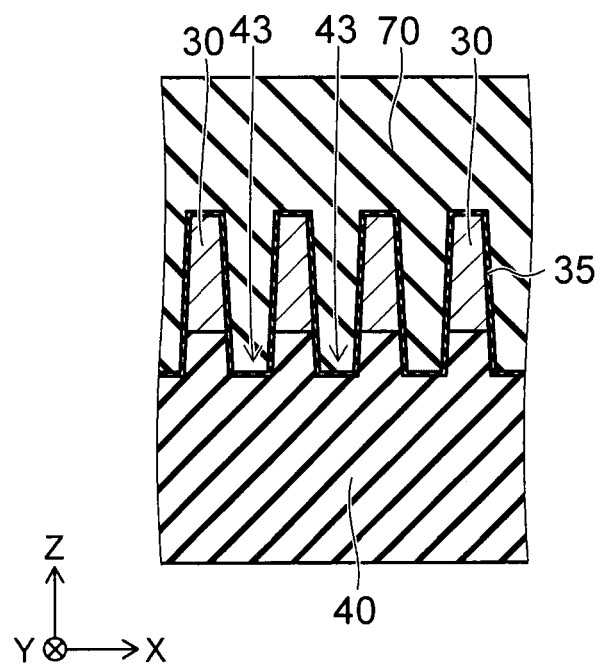

FIGS. 5A and 5B are schematic views showing cross sections after an insulating film 70 that covers the bit lines 30 is formed. The insulating film 70 is, for example, a silicon oxide film that fills the recess 43 and the space between the bit lines 30 and covers the bit lines 30.

The breakdown voltage between the adjacent bit lines 30 can be increased by interposing the nitride film 35 between the insulating film 70 and the bit lines 30. For example, electric field concentration due to the shape effect occurs easily between a lower end 30b of the bit line 30 and an edge 53b of the cutaway portion 53a adjacent to the lower end 30b. Therefore, there is a risk that the leakage current between the bit lines 30 may increase and the breakdown voltage may decrease. In the embodiment, by covering the lower end 30b and the edge 53b with the nitride film 35, the leakage current can be suppressed; and the breakdown voltage decrease can be prevented.

Figure 6A:
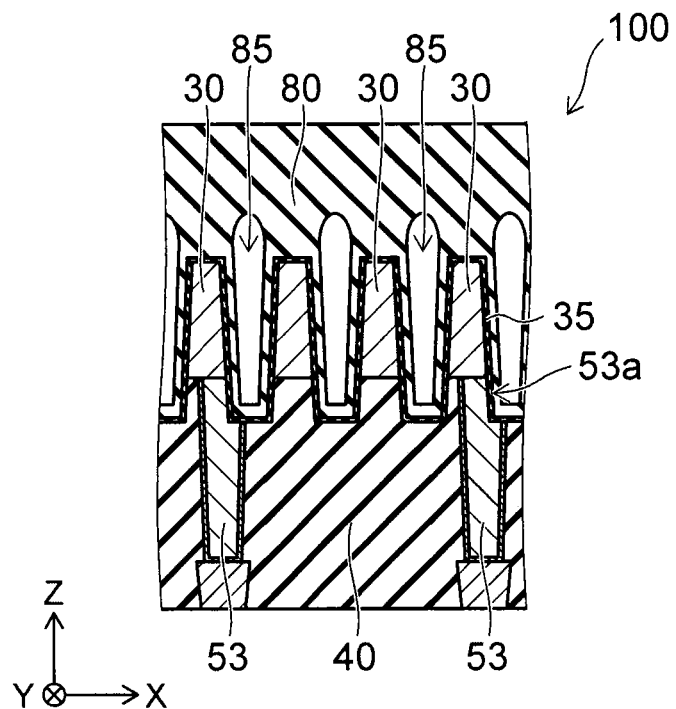
FIGS. 6A and 6B are schematic cross-sectional views showing the interconnections of the semiconductor device according to a variation of the first embodiment.
Figure 6B:
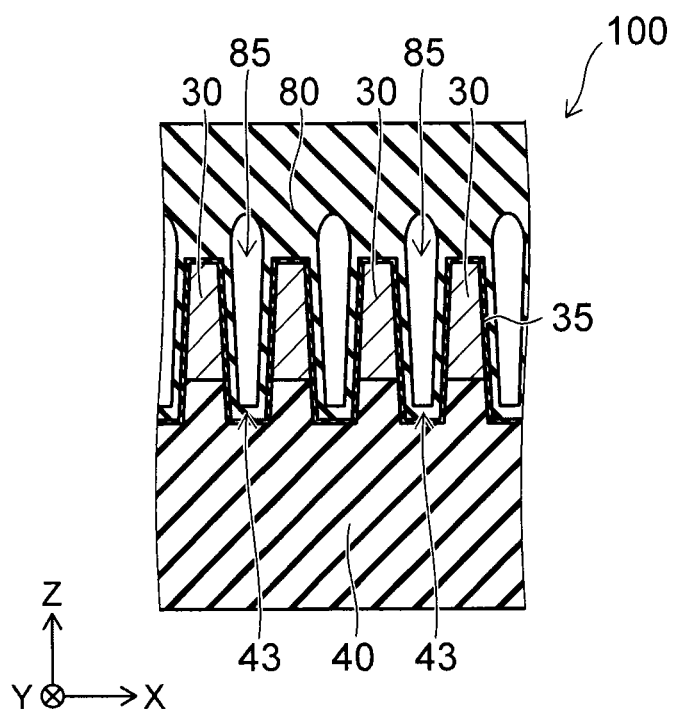

FIGS. 6A and 6B are schematic cross-sectional views showing the interconnections of the semiconductor device 100 according to a variation of the first embodiment. FIG. 6A is a cross section taken along line A-A in FIG. 1B. FIG. 6B is a cross section taken along line B-B in FIG. 1B.

In the example, an insulating film 80 that covers the bit lines 30 is provided. The insulating film 80 plugs the space between the bit lines 30 and makes a gap 85 between the adjacent bit lines 30. The insulating film 80 is, for example, a silicon oxide film formed using plasma CVD (Chemical Vapor Deposition).

In the case where the spacing of the adjacent bit lines 30 becomes narrow, it is possible to make the gap 85 by forming the insulating film 80 to be continuous on the space prior to filling the space between the bit lines 30. The gap 85 that is sealed with the insulating film 80 reduces the parasitic capacitance between the bit lines 30 and increases the operation speed of the semiconductor device 100.

Also, in the example as well, the nitride film 35 that covers the inner surfaces of the recesses 43 and the bit lines 30 is formed. Thereby, the leakage current between the lower end 30b of the bit line 30 and the edge 53b of the contact plug 53 is suppressed; and the breakdown voltage decrease can be prevented. Further, the gap 85 increases the insulation breakdown voltage between the bit lines 30.

[Second Embodiment]

FIGS. 7A to 9B are schematic cross-sectional views showing the manufacturing processes of the interconnections of the semiconductor device 100 according to a second embodiment. Each of FIG. A is a cross section taken along line A-A in FIG. 1B. Each of FIG. B is a cross section taken along line B-B in FIG. 1B.

Figure 7A:
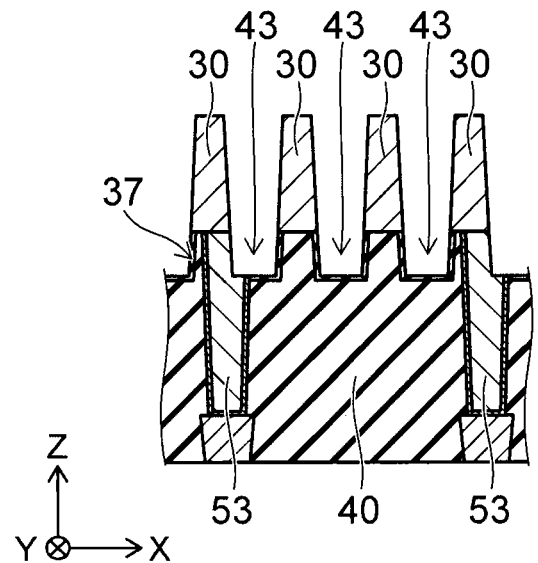
FIGS. 7A to 10B are schematic cross-sectional views showing a manufacturing processes of interconnections of a semiconductor device according to a second embodiment.
Figure 7B:
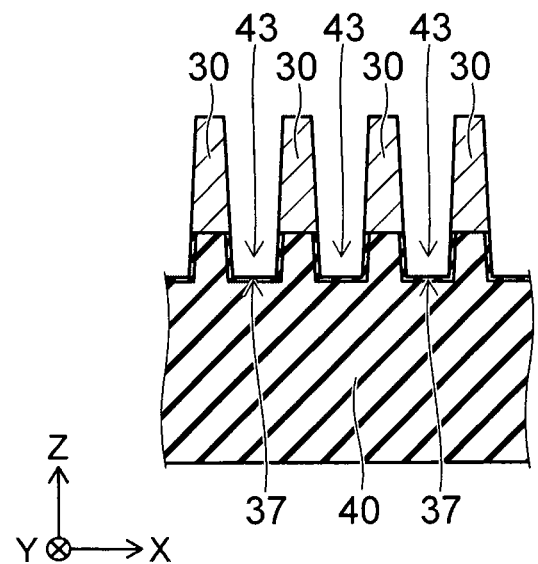

FIG. 7A and FIG. 7B are schematic cross-sectional views showing the manufacturing processes continuing from FIGS. 3A and 3B. In the example, a nitride film 37 is formed on the surface of the inter-layer insulating film 40 at the inner surfaces of the recesses 43. The nitride film 37 is, for example, a silicon nitride film or a silicon oxynitride film. For example, the nitride film 37 is formed by selectively nitriding the inter-layer insulating film 40 by plasma-excited nitrogen radicals.

For example, conditions at which the silicon oxide film is nitrided but the nitriding of the tungsten film does not progress can be realized by optimizing the temperature of the wafer exposed to the nitrogen radicals or optimizing the excitation energy of the nitrogen radicals.

Figure 8A:
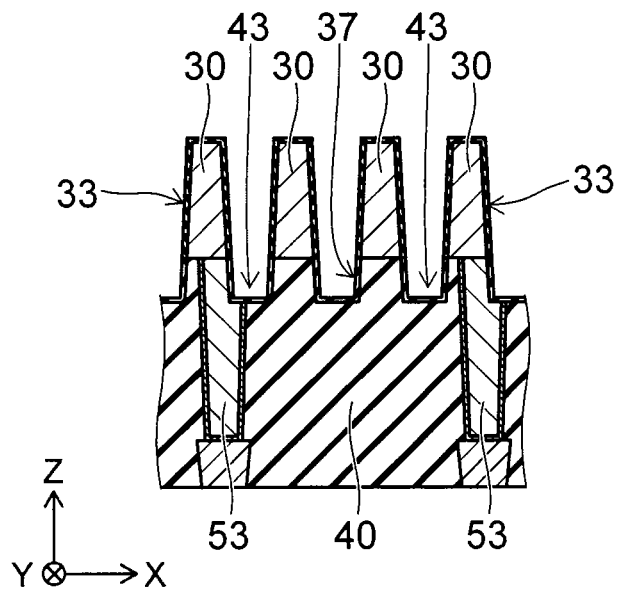
Figure 8B:
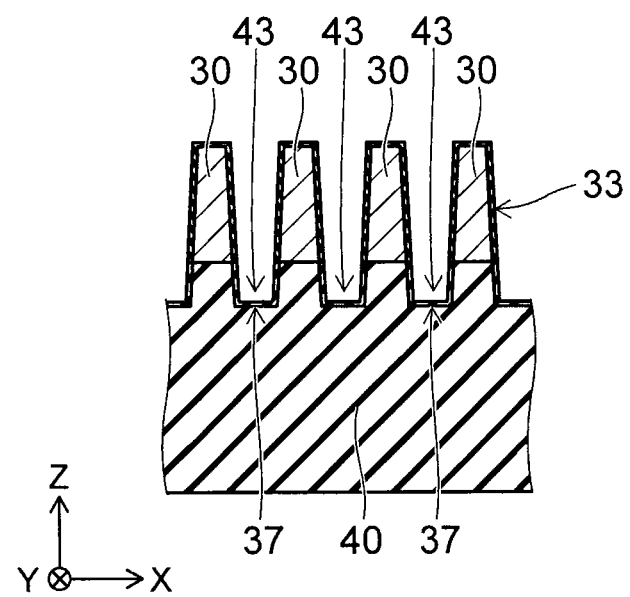

FIGS. 8A and 8B are schematic views showing cross sections after performing the loop cut of the bit lines 30. For example, the oxide film 33 is formed on the surfaces of the bit lines 30 by ashing processing using oxygen plasma after the loop cut is performed.

Figure 9A:
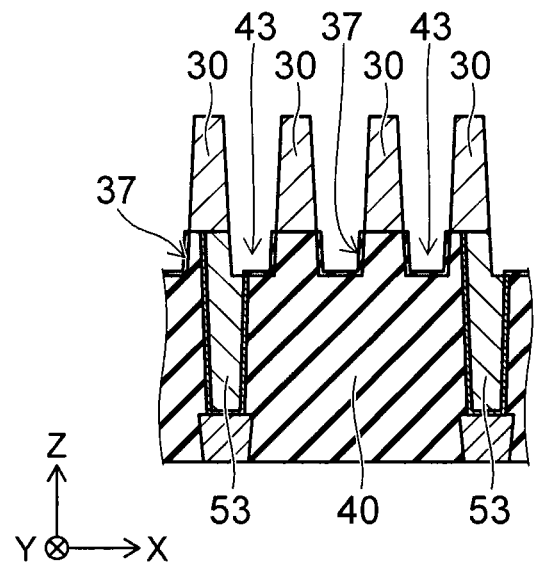
Figure 9B:
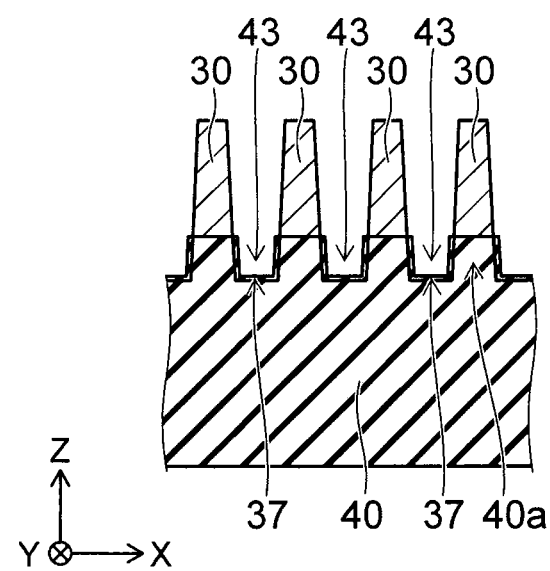

FIGS. 9A and 9B are schematic views showing cross sections after performing DHF processing and TMY processing. For example, the oxide film 33 is removed by the DHF processing. On the other hand, the configuration of the inter-layer insulating film 40 exposed at the inner surfaces of the recesses 43 is maintained because the inter-layer insulating film 40 exposed at the inner surfaces of the recesses 43 is protected by the nitride film 37. Thereby, the narrowing of the pedestal portions 40a of the bit lines 30 is avoided; and the collapse or peeling of the bit lines 30 can be prevented. Also, to prevent the narrowing of the bit lines 30, it is favorable to reduce the oxide film 33 and return the tungsten oxide to tungsten prior to the DHF processing.

Figure 10A:
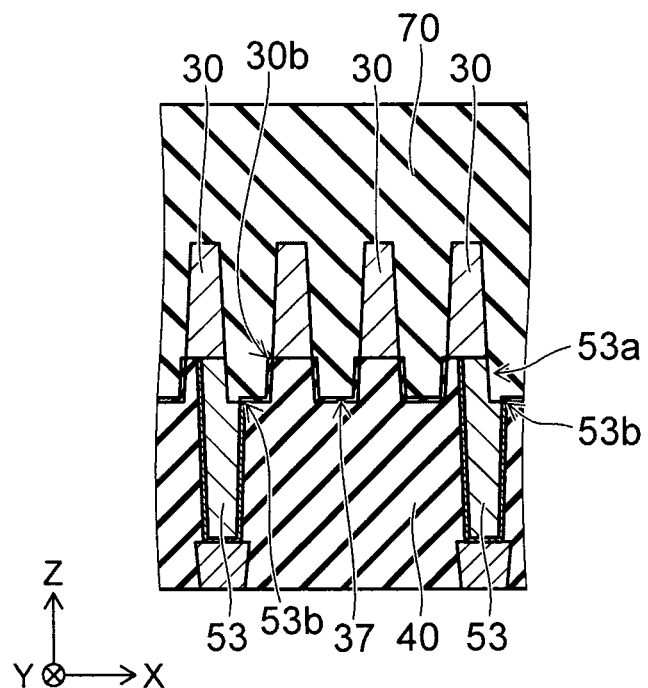
Figure 10B:
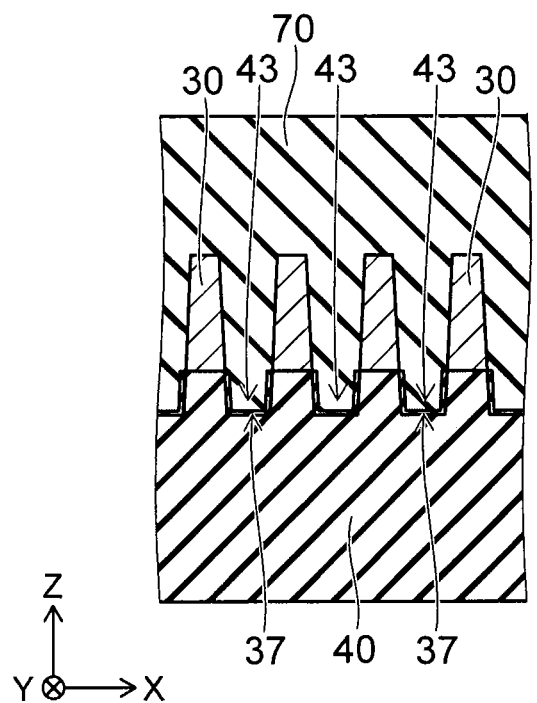

FIGS. 10A and 10B are schematic views showing cross sections after forming the insulating film 70 that covers the bit lines 30. The insulating film 70 fills the recesses 43 and the space between the bit lines 30 and covers the bit lines 30. In the example as well, the leakage current between the lower end 30b of the bit line 30 and the edge 53b of the cutaway portion 53a adjacent to the lower end 30b of the bit line 30 is suppressed by the nitride film 37 formed at the inner surfaces of the recesses 43; and the breakdown voltage decrease can be prevented.

Figure 11A:
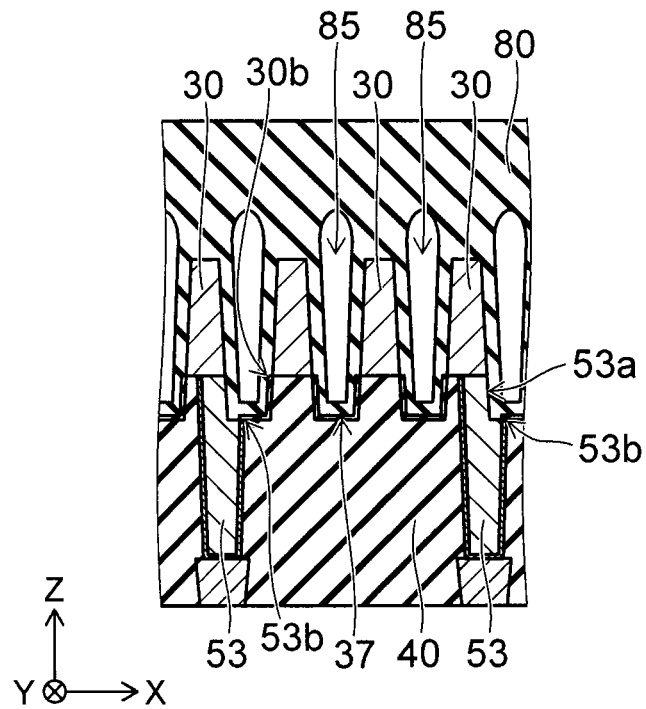
FIGS. 11A and 11B are schematic cross-sectional views showing interconnections of a semiconductor device according to a variation of the second embodiment.
Figure 11B:
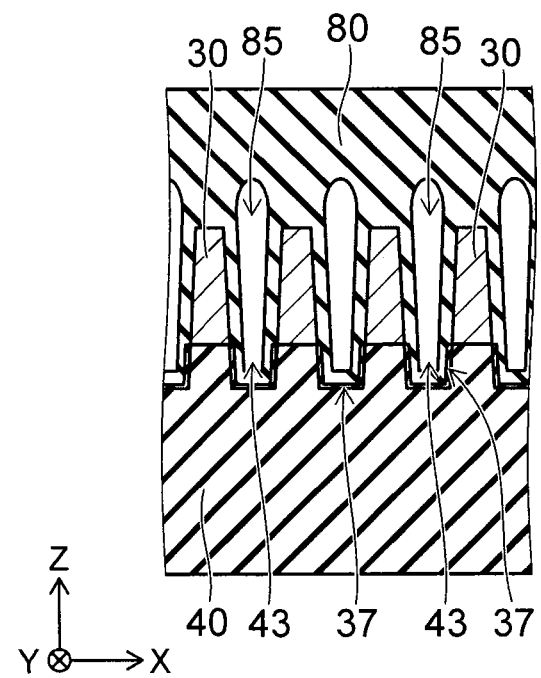

FIGS. 11A and 11B are schematic cross-sectional views showing the interconnections of the semiconductor device 100 according to a variation of the second embodiment. FIG. 11A is a cross section taken along line A-A in FIG. 1B. FIG. 11B is a cross section taken along line B-B in FIG. 1B.

In the example, the insulating film 80 that covers the bit lines 30 is provided. The insulating film 80 plugs the space between the bit lines 30 and makes the gap 85 between the adjacent bit lines 30. The gap 85 that is sealed with the insulating film 80 reduces the parasitic capacitance between the bit lines 30 and increases the operation speed of the semiconductor device 100.

In the example as well, the nitride film 37 that covers the inter-layer insulating film 40 is formed at the inner surfaces of the recesses 43; the leakage current between the lower end 30b of the bit line 30 and the edge 53b of the contact plug 53 is suppressed; and the breakdown voltage decrease can be prevented. Further, the gap 85 increases the insulation breakdown voltage between the bit lines 30.

[Third Embodiment]

Figure 12A:
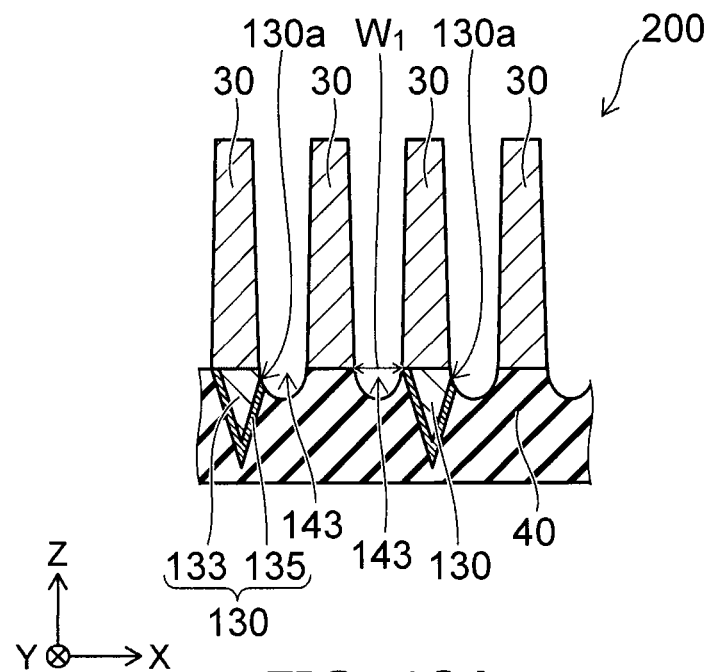
FIGS. 12A and 12B are schematic cross-sectional views showing interconnections of a semiconductor device according to a third embodiment.
Figure 12B:
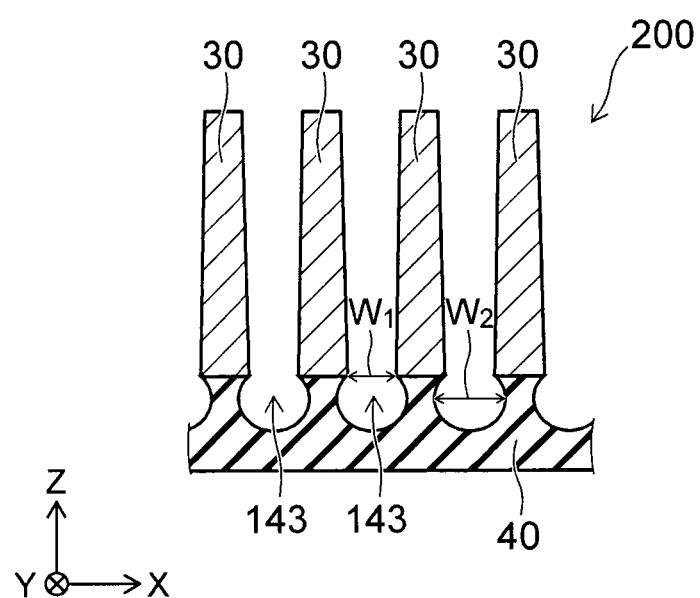

FIGS. 12A and 12B are schematic cross-sectional views showing the interconnections of a semiconductor device 200 according to a third embodiment. In the example, anchor units 130 are provided at the lower portions of first interconnections (hereinbelow, the bit lines 30). FIG. 12A is a schematic view showing a cross section of the portion where the anchor units 130 are provided. FIG. 12B is a schematic view showing a cross section of the portion where the anchor units 130 are not provided.

As shown in FIGS. 12A and 12B, the bit lines 30 are provided on the inter-layer insulating film 40. The inter-layer insulating film 40 has a recess 143 directly under the space between the adjacent bit lines 30. The recess 143 is made to communicate with the space between the bit lines 30 via an opening having the same width as the spacing W1 between the adjacent bit lines 30. Also, for example, in the X-direction, the recess 143 is made to have the width W2 that is wider than the spacing W1 between the bit lines 30. In other words, the recess 143 may be made to spread under the bit lines 30.

As shown in FIG. 12A, the multiple anchor units 130 that extend inside the inter-layer insulating film 40 are provided directly under the bit lines 30. Each of the anchor units 130 is partially provided directly under the bit line 30. Also, the anchor units 130 are connected to the bit lines 30 and prevent the collapse or peeling of the bit lines 30.

The anchor unit 130 includes, for example, a barrier metal 133 that contacts the inter-layer insulating film 40, and a conductor 135 that is provided on the barrier metal 133. The barrier metal 133 is, for example, tungsten nitride (TiN). The conductor 135 is, for example, tungsten. Also, the anchor unit 130 includes, for example, a cutaway portion 130a in which a portion of the upper end of the anchor unit 130 is etched when etching the recess 143. Then, the spread of the recess 143 in the X-direction is suppressed at the portion where the anchor unit 130 is provided. In other words, the width in the X-direction of the recess 143 is narrower than W2.

Further, the semiconductor device 200 includes the contact plugs 53 connected to the bit lines 30 at not-shown portions. In other words, the anchor units 130 are provided at portions where there are no contact plugs 53.

A method for manufacturing the interconnections of the semiconductor device 200 according to the third embodiment will now be described with reference to FIGS. 13A to 18C. FIGS. 13A to 18C are schematic cross-sectional views showing the manufacturing processes of the interconnections of the semiconductor device 200.

Figure 13A:
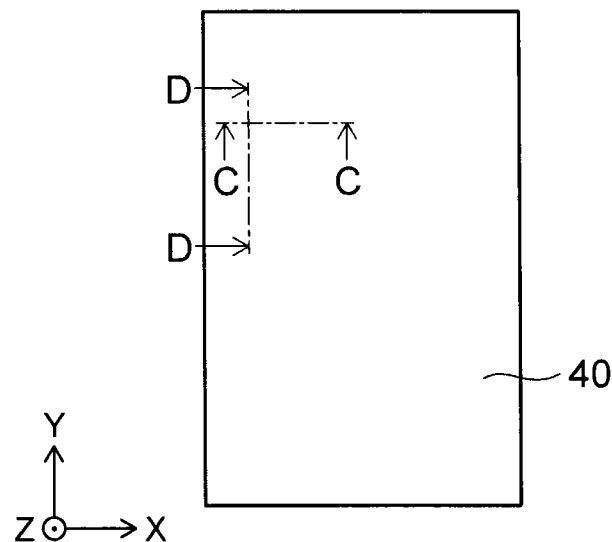
FIGS. 13A to 18C are schematic cross-sectional views showing a manufacturing processes of the interconnections of the semiconductor device according to the third embodiment.

FIGS. 13A to 18C are schematic views showing the inter-layer insulating film 40. FIG. 13A is a top view showing the inter-layer insulating film 40. FIG. 13B is a schematic view showing a cross section along line C-C shown in FIG. 13A. FIG. 13C is a schematic view showing a cross section along line D-D shown in FIG. 13A. Also, each FIG. B shown hereinbelow is a schematic view showing a cross section along line C-C; and each FIG. C is a schematic view showing a cross section along line D-D.

Figure 13B:
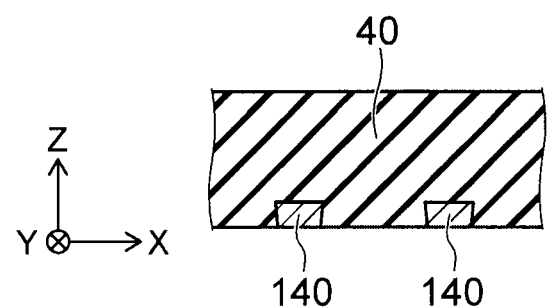
Figure 13C:
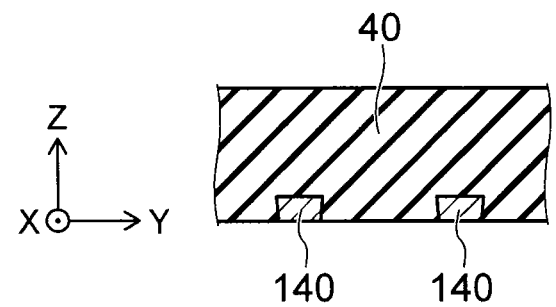

The inter-layer insulating film 40 shown in FIG. 13A to FIG. 13C covers the semiconductor layer 10, the memory cells 20, and the selection gates 27. The inter-layer insulating film 40 includes second interconnections (e.g., gate interconnections 140) provided in the interconnection layer M0. For example, the gate interconnections 140 electrically connect the control gates 25 of the memory cells 20 to the peripheral circuit.

Figure 14A:
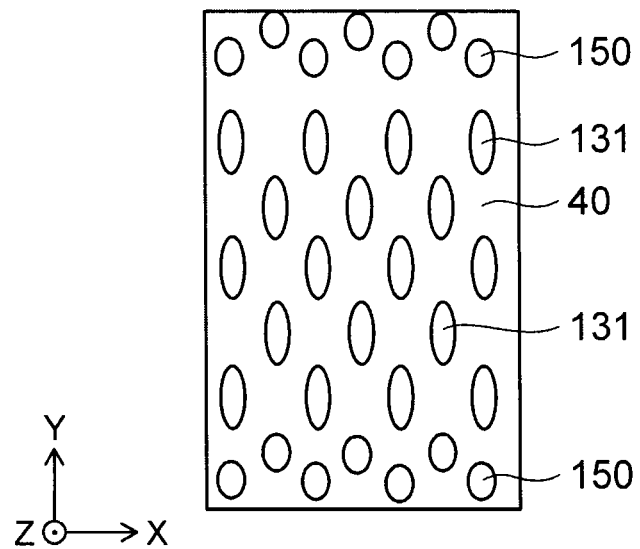
Figure 14B:
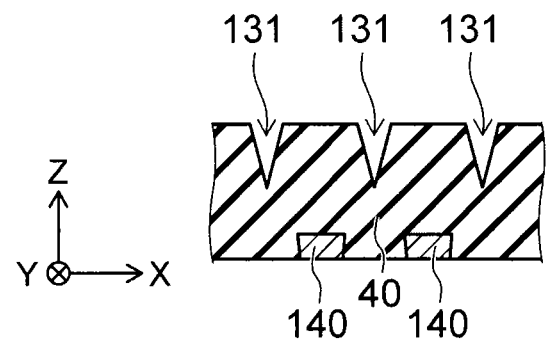
Figure 14C:
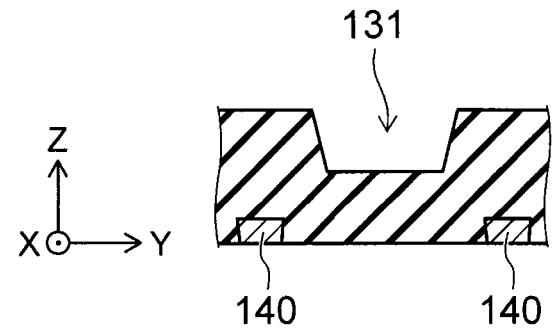

FIGS. 14A to 14C are schematic views showing the inter-layer insulating film 40 in which multiple via holes 131 and 150 are made. The via holes 131 are made at the portions where the anchor units 130 are formed. The via holes 150 are provided at the portions where the contact plugs 53 are formed.

The via holes 131 are provided at a depth that is shallower than the gate interconnections 131 in the inter-layer insulating film 40. As shown in FIGS. 15B and 15C, the via holes 131 are provided at positions so that the via holes 131 and the gate interconnections 140 do not overlap when viewed in the top view. Also, the via holes 150 are made to a depth that reaches the interconnection layer M0 to communicate with the contact plugs 51.

For example, a pattern used to make the via holes 131 and 150 is formed in the region of the inter-layer insulating film 40 corresponding to being directly under the bit lines 30 by photolithography. As shown in FIG. 14A, for example, the via holes 131 and 150 are made to be ellipses having major diameters in a direction along the bit lines 30.

For example, the pattern that is used to make the via holes 131 is formed so that the width in the X-direction is narrower than that of the pattern used to make the via holes 150. Thereby, the via holes 131 and the via holes 150 that have different depths can be made simultaneously using dry etching. In other words, the etching rate of the inter-layer insulating film 40 is slower for the via holes 131 having the narrow widths in the X-direction; and the via holes 131 are made to be shallower than the via holes 150.

Figure 15A:
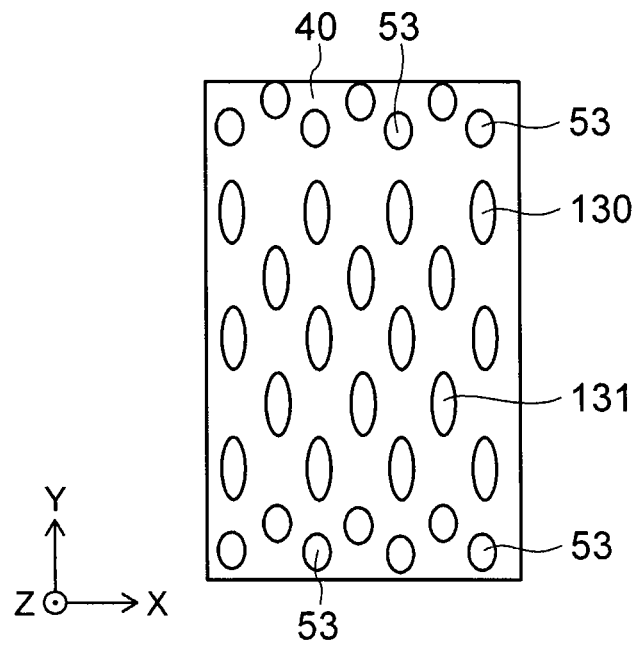
Figure 15B:
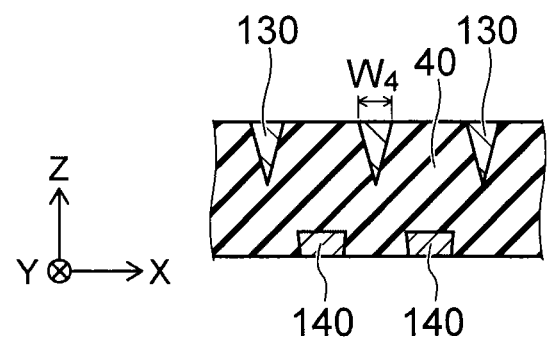
Figure 15C:
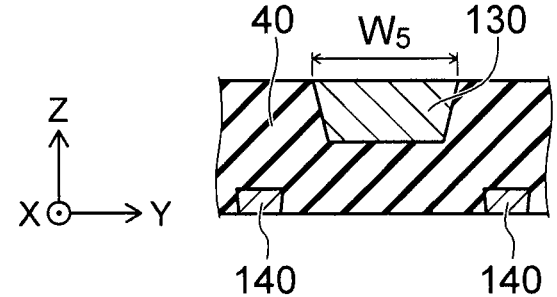

FIGS. 15A to 15C are schematic views showing the contact plugs 53 and the anchor units 130 formed inside the inter-layer insulating film 40. For example, the via holes 131 and 150 are filled by depositing a TiN film and a tungsten film on the inter-layer insulating film 40. Continuing, for example, the tungsten film and the TiN film that are deposited on the inter-layer insulating film 40 are removed by CMP (Chemical Mechanical Polish) so that the portions filled into the interiors of the via holes 131 and 150 remain. Thereby, the anchor units 130 and the contact plugs 53 can be formed respectively in the interiors of the via holes 131 and 150.

As shown in FIG. 15B and FIG. 15C, a width W4 in the X-direction of the anchor unit 130 is narrower than a width W5 in the Y-direction of the anchor unit 130. Also, the anchor units 130 are formed at positions so that the anchor units 130 and the gate interconnections 140 do not overlap when viewed in the top view. Thereby, the leakage current between the gate interconnections 140 and the bit lines 30 formed on the anchor units 130 is suppressed; and the insulation breakdown voltage can be increased.

Figure 16A:
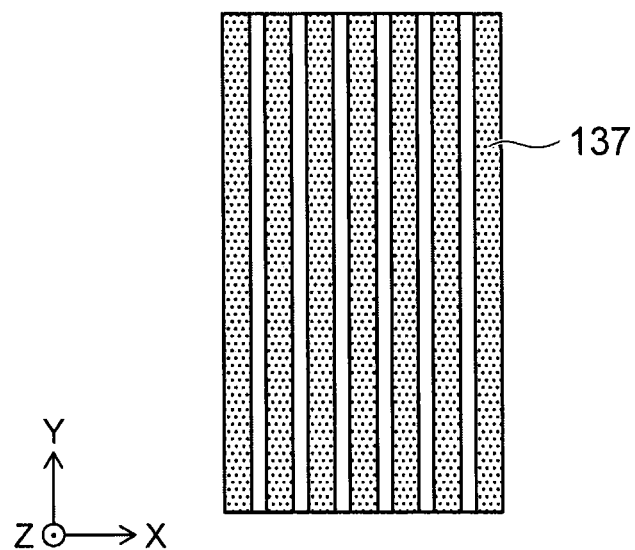
Figure 16B:
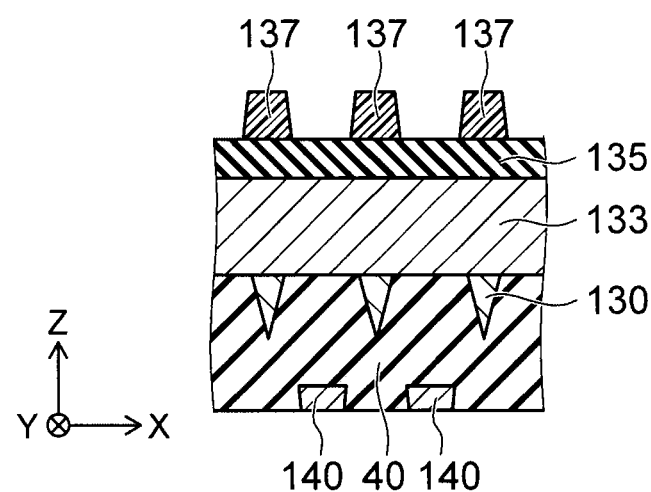
Figure 16C:
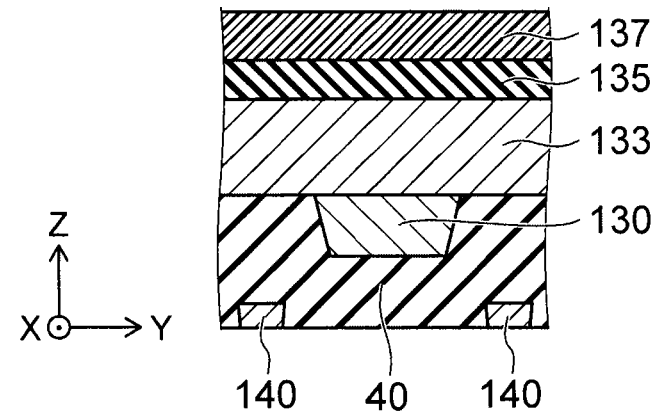

FIGS. 16A to 16C are schematic views showing the tungsten film 133 and a mask material 135 deposited on the inter-layer insulating film 40. The mask material 135 is, for example, a silicon oxide film. Further, a resist mask 137 that corresponds to the bit lines 30 is formed on the mask material 135. Continuing, a hard mask 135a is formed by etching the mask material 135 using the resist mask 137 (referring to FIG. 17B).

Figure 17A:
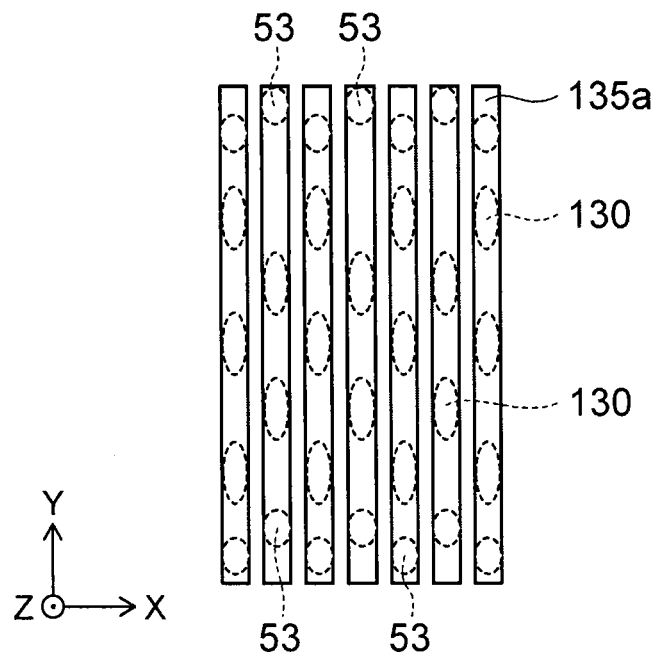
Figure 17B:
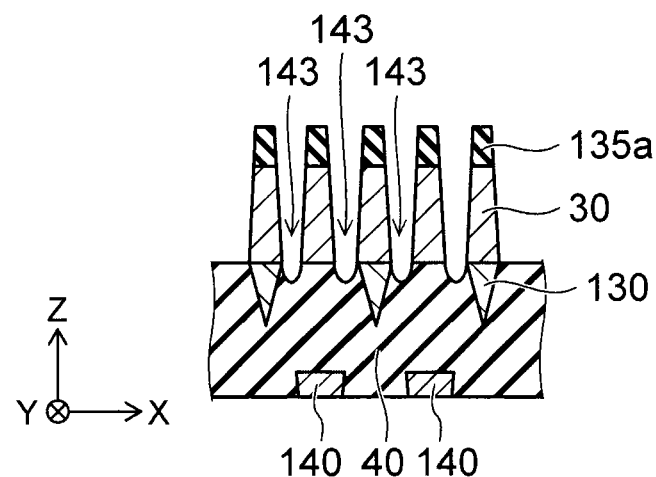
Figure 17C:
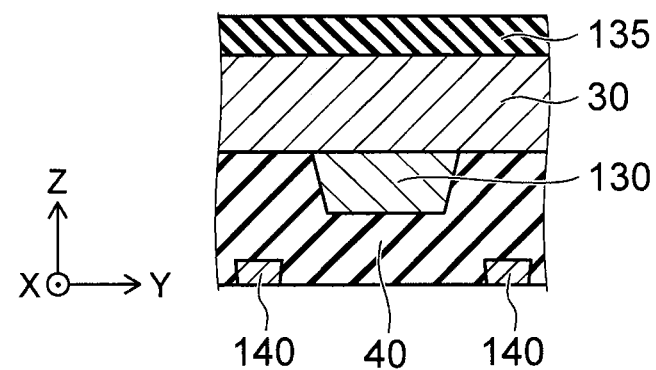

FIGS. 17A to 17C are schematic views showing the etched tungsten film. The multiple bit lines 30 are formed by selectively etching the tungsten film 133 using the hard mask 135a. The bit lines 30 are positioned respectively on the anchor units 130. Further, the recess 143 is made directly under the space between the adjacent bit lines 30 by etching the inter-layer insulating film 40 using the bit lines 30 as a mask.

For example, the cutaway portion 130*a* is formed by cutting away the end of the anchor unit jutting from directly under the bit line 30 in the etching of the recess 143 (referring to FIG. 12A). In other words, side etching of the inter-layer insulating film 40 can be suppressed by the end surface of the anchor unit 130 being exposed at the inner surface of the recess 143.

Figure 18A:
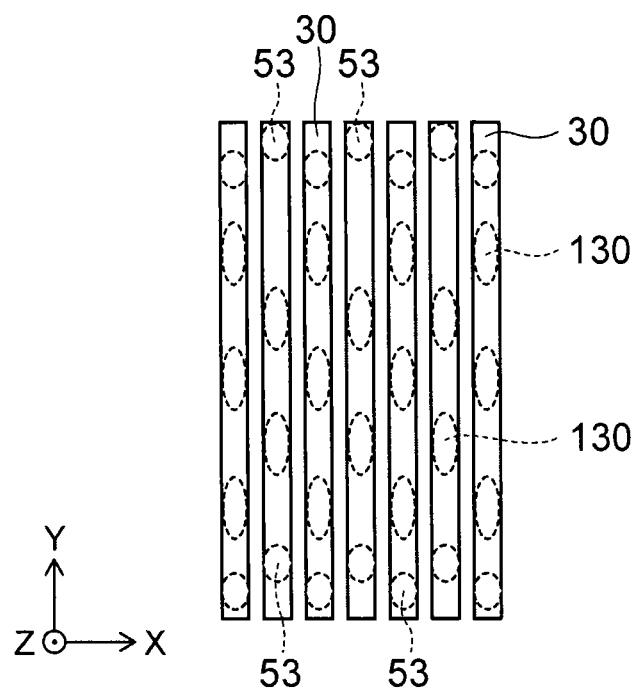
Figure 18B:
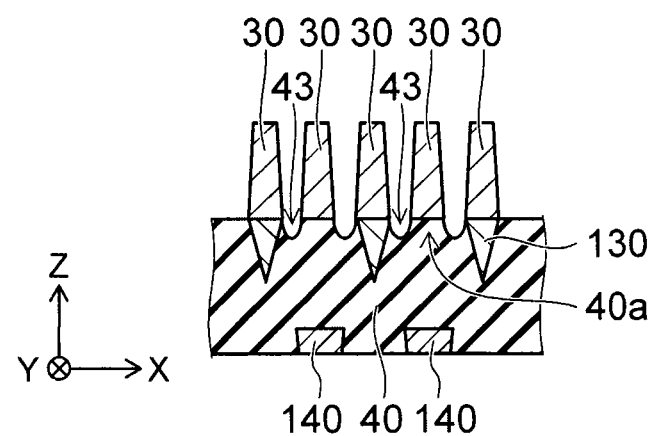
Figure 18C:
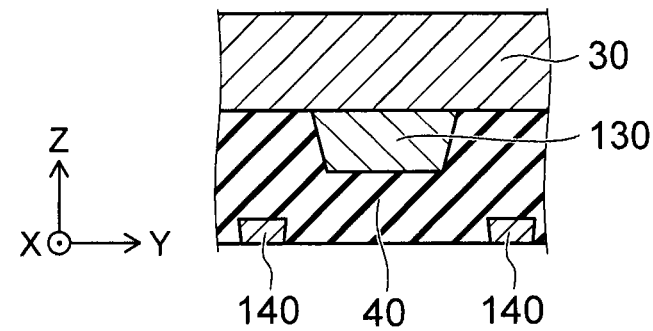

FIGS. 18A to 18C are schematic views showing the completed bit lines 30. For example, the hard mask 135*a* is removed by DHF processing. Also, the oxide film (not shown) that is formed on the side surfaces of the bit lines 30 is removed.

Each of the bit lines 30 is connected to the anchor unit 130 and the contact plug 53. Accordingly, even in the case where the pedestal portion 40*a* directly under the bit line 30 is narrowed by the side etching, the bonding strength of the bit line 30 to the inter-layer insulating film 40 is maintained; and the collapse and/or peeling of the bit line 30 can be prevented. Thereby, the decrease of the manufacturing yield of the semiconductor device 200 can be avoided.

Figure 19A:
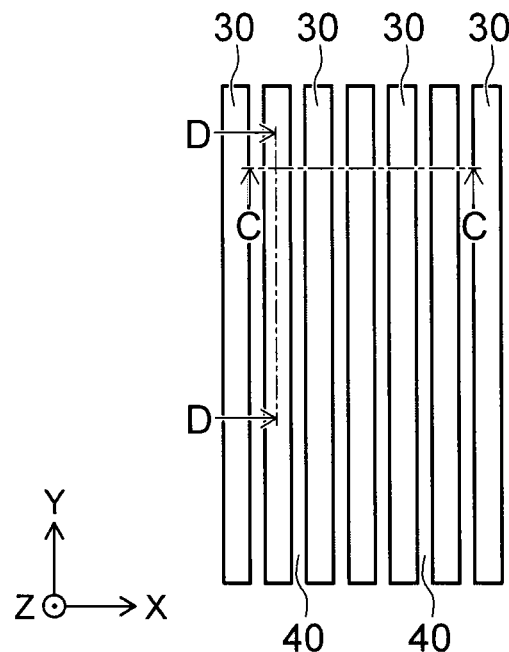
FIGS. 19A to 19C are schematic cross-sectional views showing interconnections of a semiconductor device according to a variation of the third embodiment.
Figure 19B:
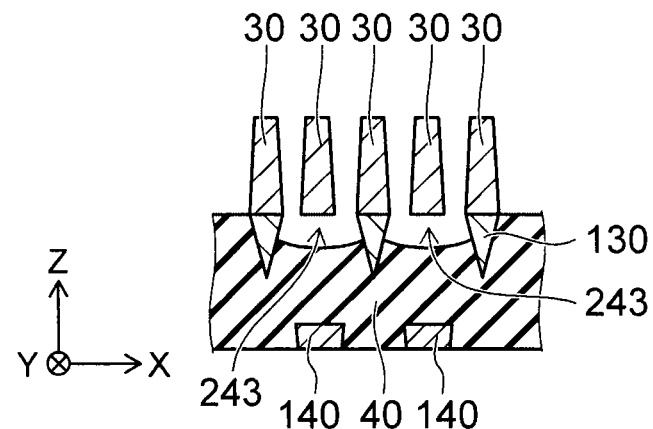
Figure 19C:
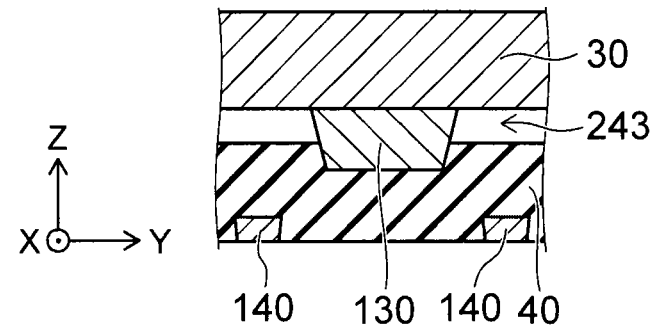

FIGS. 19A to 19C are schematic cross-sectional views showing the interconnections of the semiconductor device 200 according to a variation of the third embodiment.

In the embodiment, the bit lines 30 are supported by the anchor units 130. Accordingly, for example, when making the recess 143, the inter-layer insulating film 40 directly under the bit lines 30 is etched; and a recess 243 that is continuous via the voids directly under the bit lines 30 can be made. For example, in the case where the insulating film 80 that plugs the space between the adjacent bit lines 30 is formed as shown in FIGS. 6A and 6B, the parasitic capacitance between the bit lines 30 can be reduced because the voids directly under the bit lines 30 also are used as air gaps. Thereby, the operation speed of the semiconductor device 200 can be improved.

[Fourth Embodiment]

Figure 20A:
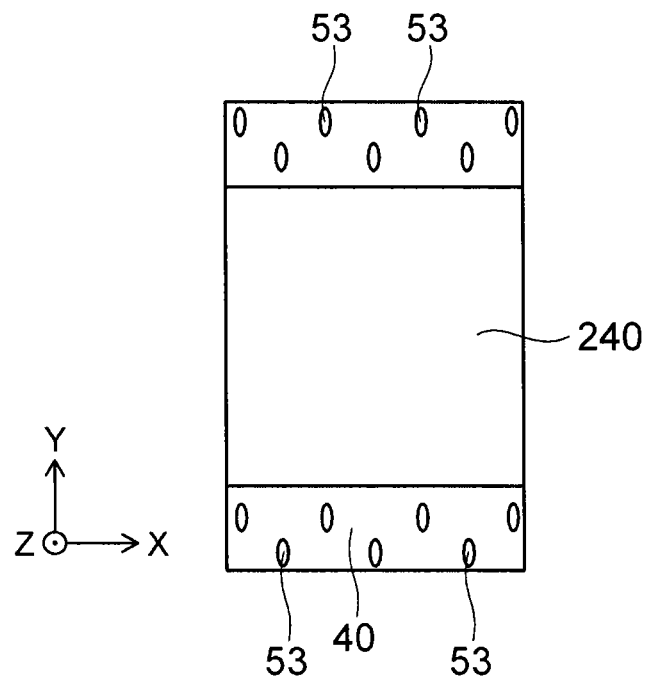
FIGS. 20A to 21C are schematic cross-sectional views showing a manufacturing processes of interconnections of a semiconductor device according to a fourth embodiment.
Figure 20B:
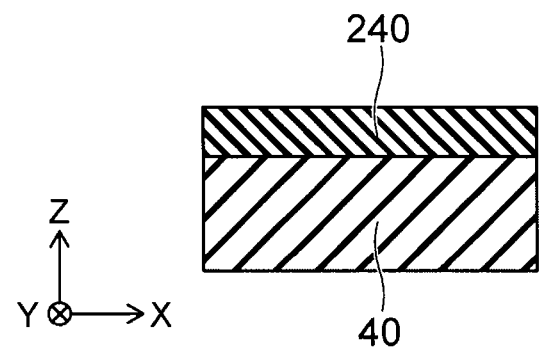
Figure 20C:
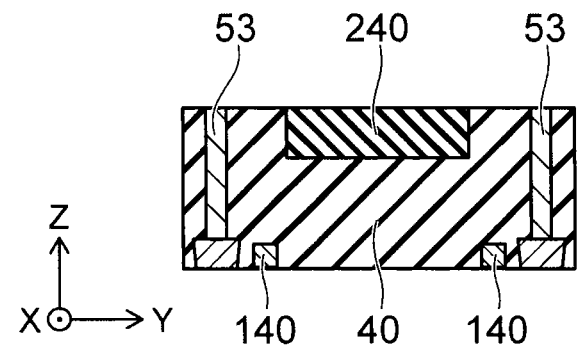
Figure 21A:
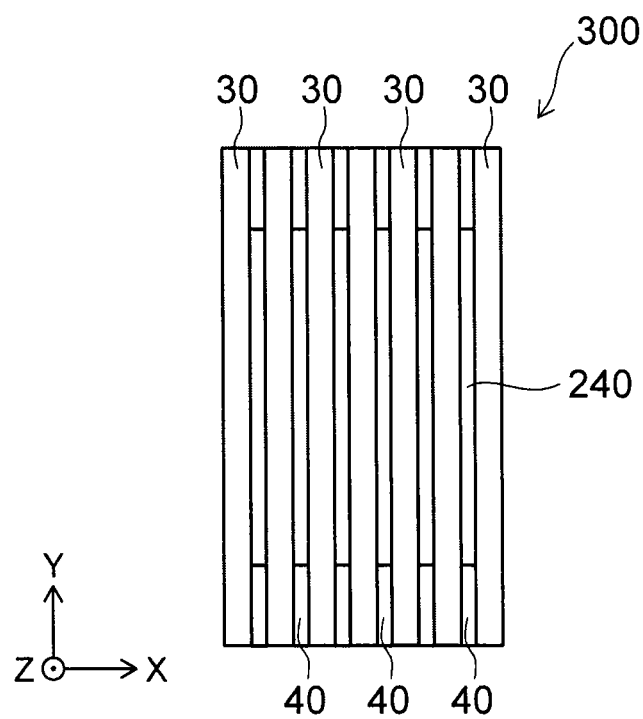
Figure 21B:
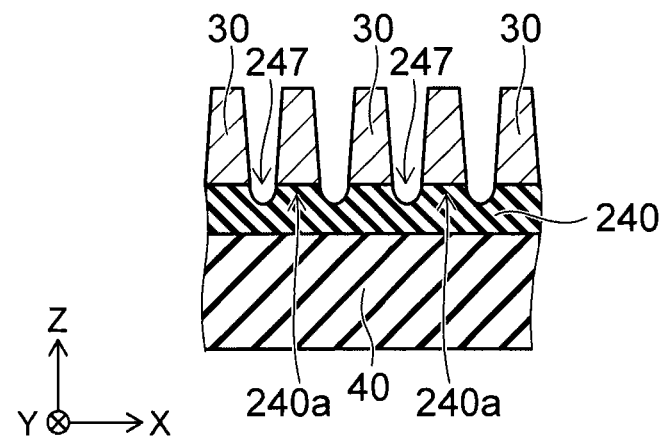
Figure 21C:
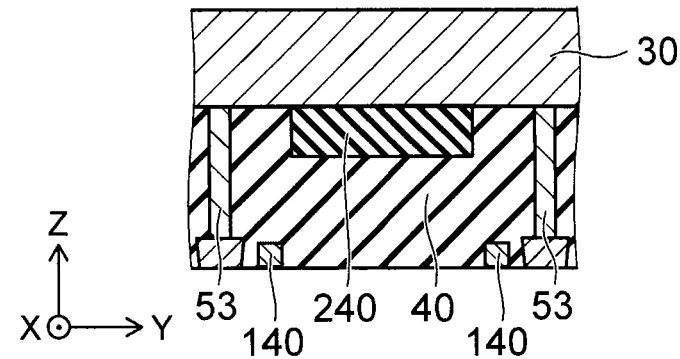

FIGS. 20A to 21C are schematic cross-sectional views showing the manufacturing processes of the interconnections of a semiconductor device 300 according to a fourth embodiment. FIG. 20A and FIG. 21A are top views showing the inter-layer insulating film 40. FIGS. 20B and 21B are, for example, schematic views showing cross sections along line C-C shown in FIG. 13A. FIGS. 20C and 21C are, for example, schematic views showing cross sections along line D-D shown in FIG. 13A.

FIGS. 20A to 20C are schematic views showing the inter-layer insulating film 40 in which the contact plugs 53 and an insulating film 240 are formed. The contact plugs 53 extend downward through the inter-layer insulating film 40 and are electrically connected to the contact plugs 51 of the lower layer. The contact plugs 53 have, for example, a stacked structure of a TiN film and a tungsten film filled into the inter-layer insulating film 40.

In the embodiment, the insulating film 240 is formed on the inter-layer insulating film 40 in the region between the portions where the contact plugs 53 are formed. The insulating film 240 is, for example, a silicon nitride film and is selectively filled into the inter-layer insulating film 40. For example, a recess is made in the portion where the insulating film 240 is to be filled by selectively etching the inter-layer insulating film 40. Continuing, the insulating film 240 is deposited on the inter-layer insulating film 40; subsequently, the portion that is deposited on the upper surface of the inter-layer insulating film 40 is removed by CMP; and the portion that fills the recess remains.

The inter-layer insulating film 40 may include gate interconnections 140. The insulating film 240 is preferably provided so as not to overlap in the Z-direction with the gate interconnections 140.

It is sufficient for the material of the insulating film 240 to be resistant to the etching of the inter-layer insulating film 40. Also, the insulating film 240 is not limited to the configuration shown in FIG. 20A and may be, for example, filled in a lattice configuration when viewed in the top view.

FIGS. 21A to 21C are schematic views showing the bit lines 30 formed on the inter-layer insulating film 40. For example, the bit lines 30 can be formed by the same method as the processes shown in FIGS. 16A to 17C.

In the embodiment as shown in FIG. 21B, recesses 247 are made by etching the insulating film 240 using the bit lines 30 as a mask. For example, the insulating film 240 is more resistant to the DHF processing and the TMY processing than is the inter-layer insulating film 40. Accordingly, for example, the etching of pedestal portions 240*a* of the bit lines 30 can be suppressed in the processing after the bit lines 30 are formed by etching the tungsten film. Thereby, the collapse and/or peeling of the bit lines 30 are prevented; and the manufacturing yield of the semiconductor device 300 can be improved.

The first to fourth embodiments recited above are not limited to the examples; and appropriate combinations may be implemented. For example, the anchor units 130 may be formed directly under the bit lines 30 of the first embodiment and the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor layer;
   a first insulating film provided on the semiconductor layer and having a first surface facing the semiconductor layer and a second surface opposite to the semiconductor layer, the first insulating film including a first protruding portion, a second protruding portion, and a recessed portion between the first protruding portion and the second protruding portion, the first protruding portion and the second protruding portion extending in a first direction along the second surface, and being adjacent to each other in a second direction crossing the first direction;
   a first interconnection provided on the first protruding portion and contacting a top surface of the first protruding portion, and extending in the first direction along the first protruding portion;
   a second interconnection provided on the second protruding portion and contacting a top surface of the second protruding portion, and extending in the first direction along the second protruding portion;
   a conductor extending into the first insulating film in a third direction from the second surface of the first insulating film toward the semiconductor layer, the conductor being connected to the first interconnection; and a nitrided layer covering the first interconnection, the second interconnection and the recessed portion wherein the nitrided layer contacts the first insulating layer in the recessed portion; and wherein the conductor has a side surface exposed in the recessed portion, and the nitrided covers the side surface of the conductor in the recessed portion.

2. The semiconductor device according to claim 1, further comprising a second insulating film covering the first interconnection, the second interconnection and the recessed portion via the nitrided layer.

3. The semiconductor device according to claim 1, further comprising a second insulating film covering the first interconnection and the second interconnection, wherein the second insulating film includes a portion bridging the first interconnection and the second interconnection over a space between the first interconnection and the second interconnection.

4. The semiconductor device according to claim 1, further comprising multiple memory cells sharing the semiconductor layer.

5. The semiconductor device according to claim 1, wherein the first interconnection is in contact with the conductor.

6. The semiconductor device according to claim 1, wherein the conductor has a first width in the second direction at a level of the recessed portion and a second width in the second direction at a level under the recessed portion, the first width being narrower than the second width.

7. The semiconductor device according to claim 1, wherein the nitrided layer is in contact with the conductor in the recessed portion.

8. The semiconductor device according to claim 1, wherein the first interconnection and the second interconnection have side surfaces and top surfaces respectively, and the nitrided layer is in contact with side surfaces and top surfaces of the first interconnection and the second interconnection.

9. The semiconductor device according to claim 1, wherein the first interconnection and the second interconnection have side surfaces respectively, each of the side surfaces being in plane with a side surface of the recessed portion at around the top surface of the first protruding portion or the second protruding portion.

* * * * *